United States Patent [19]
Jackson et al.

[11] Patent Number: 5,245,646
[45] Date of Patent: Sep. 14, 1993

[54] TUNING CIRCUIT FOR USE WITH AN INTEGRATED CONTINUOUS TIME ANALOG FILTER

[75] Inventors: H. Spence Jackson, Austin; Roger A. Whatley, Georgetown, both of Tex.

[73] Assignee: Motorola, Inc., Schaumburg, Ill.

[21] Appl. No.: 891,082

[22] Filed: Jun. 1, 1992

[51] Int. Cl.$^5$ .................................. H03M 1/12
[52] U.S. Cl. ........................... 377/2; 377/42; 341/158; 341/166; 307/521; 328/129.1
[58] Field of Search ............ 377/2, 42; 341/158, 341/166; 307/521; 328/129.1

[56] References Cited

U.S. PATENT DOCUMENTS

| | | | |
|---|---|---|---|
| 3,818,246 | 6/1974 | Hellworth et al. | 307/577 |
| 4,352,010 | 9/1982 | Koogler | 377/42 |
| 4,661,803 | 4/1987 | Nishiyama et al. | 341/166 |
| 4,672,361 | 7/1987 | Kokubo et al. | 341/166 |
| 4,675,649 | 6/1987 | Forehand et al. | 341/166 |
| 4,733,205 | 3/1988 | Hughes | 333/172 |
| 4,783,644 | 11/1988 | Kilchsperger | 341/166 |
| 4,791,379 | 12/1988 | Hughes | 307/521 |
| 4,939,519 | 7/1990 | Elbert | 341/166 |
| 4,965,578 | 10/1990 | Poujois | 341/166 |
| 5,059,836 | 10/1991 | Lee et al. | 307/520 |
| 5,124,593 | 6/1992 | Michel | 307/521 |
| 5,128,676 | 7/1992 | Ordway | 341/166 |
| 5,187,445 | 2/1993 | Jackson | 328/167 |

OTHER PUBLICATIONS

IEEE Transactions On Circuits and Systems, vol. 33, No. 2, Feb. 1986, New York, U.S., Tsividis, "Continuous-Time MOSFET-C Filters In VLSI", pp. 125-140.

Primary Examiner—John S. Heyman
Assistant Examiner—Scott A. Ouellette
Attorney, Agent, or Firm—Robert L. King

[57] ABSTRACT

A tuning circuit (10) and method of operation for tuning an analog filter (40). The tuning circuit (10) has an integrator with an input portion (12) and a comparator portion (14), a counter (32), and a decoder (34). The integrator is implemented with an RC time constant which is proportional to an RC time constant of the analog filter (40). The comparator portion (14) provides an enable signal during the RC time constant of the integrator to the counter (16) which quantizes the RC time constant relative to a clock period of the counter (16). A predetermined decoding is performed to provide an output control signal to control adjustment of the RC time constant of the analog filter (40).

11 Claims, 3 Drawing Sheets

| DECODER TRUTH TABLE |||||||||||
|---|---|---|---|---|---|---|---|---|---|
| INPUT ||||| OUTPUT |||||
| | | | | | B4 | B3 | B2 | B1 | B0 |
| 0 | 0 | 0 | 0 | 0 | 1 | 1 | 1 | 1 | 1 |
| 0 | 0 | 0 | 0 | 1 | 1 | 1 | 1 | 1 | 1 |
| 0 | 0 | 0 | 1 | 0 | 1 | 1 | 1 | 1 | 1 |
| 0 | 0 | 0 | 1 | 1 | 1 | 1 | 1 | 0 | 1 |
| 0 | 0 | 1 | 0 | 0 | 1 | 0 | 1 | 1 | 0 |
| 0 | 0 | 1 | 0 | 1 | 1 | 0 | 0 | 1 | 0 |
| 0 | 0 | 1 | 1 | 0 | 0 | 1 | 1 | 1 | 1 |
| 0 | 1 | 0 | 0 | 0 | 0 | 1 | 0 | 1 | 1 |
| 0 | 1 | 0 | 0 | 1 | 0 | 1 | 0 | 1 | 0 |
| 0 | 1 | 0 | 1 | 0 | 0 | 1 | 0 | 0 | 1 |
| 0 | 1 | 0 | 1 | 1 | 0 | 1 | 0 | 0 | 0 |
| 0 | 1 | 1 | 0 | 0 | 0 | 1 | 0 | 0 | 0 |
| 0 | 1 | 1 | 0 | 1 | 0 | 0 | 1 | 1 | 1 |
| 0 | 1 | 1 | 1 | 0 | 0 | 0 | 1 | 1 | 1 |
| 0 | 1 | 1 | 1 | 1 | 0 | 0 | 1 | 1 | 0 |
| 1 | 0 | 0 | 0 | 0 | 0 | 0 | 1 | 1 | 0 |
| 1 | 0 | 0 | 0 | 1 | 0 | 0 | 1 | 1 | 0 |
| 1 | 0 | 0 | 1 | 0 | 0 | 0 | 1 | 0 | 1 |
| 1 | 0 | 0 | 1 | 1 | 0 | 0 | 1 | 0 | 1 |
| 1 | 0 | 1 | 0 | 0 | 0 | 0 | 1 | 0 | 1 |
| 1 | 0 | 1 | 0 | 1 | 0 | 0 | 1 | 0 | 1 |
| 1 | 0 | 1 | 1 | 0 | 0 | 0 | 1 | 0 | 0 |
| 1 | 0 | 1 | 1 | 1 | 0 | 0 | 1 | 0 | 0 |
| 1 | 1 | 0 | 0 | 0 | 0 | 0 | 1 | 0 | 0 |
| 1 | 1 | 0 | 0 | 1 | 0 | 0 | 1 | 0 | 0 |
| 1 | 1 | 0 | 1 | 0 | 0 | 0 | 1 | 0 | 0 |
| 1 | 1 | 0 | 1 | 1 | 0 | 0 | 1 | 0 | 0 |
| 1 | 1 | 1 | 0 | 0 | 0 | 0 | 0 | 1 | 1 |
| 1 | 1 | 1 | 0 | 1 | 0 | 0 | 0 | 1 | 1 |
| 1 | 1 | 1 | 1 | 0 | 0 | 0 | 0 | 1 | 1 |
| 1 | 1 | 1 | 1 | 1 | 0 | 0 | 0 | 1 | 1 |

*FIG.2*

TUNING CIRCUIT FOR USE WITH AN INTEGRATED CONTINUOUS TIME ANALOG FILTER

FIELD OF THE INVENTION

The present invention generally relates to filters, and more specifically to analog filter tuner circuitry.

BACKGROUND OF THE INVENTION

Analog electronic filter circuits are an integral part of a wide variety of electronic and semiconductor products. Filter circuits generally perform a predetermined function of preventing and permitting certain signal frequencies to be communicated. Analog filter circuits are characterized by being implemented with components such as resistors and capacitors. Resistors and capacitors can each be chosen to have one of a wide variety of component values. However, all integrated circuit analog component values, including resistors and capacitors, are subject to variation of the component value as a function primarily of temperature and processing (i.e. manufacturing) variations. Therefore, tuning circuits may be used with analog filter circuits in order to fine tune or adjust the filter to compensate for variation in the filter's analog components.

One well known category of analog filters is the switched capacitor filter, so called because only switches and capacitors are used with an amplifier. An advantage of the switched capacitor filter is that resistors, which can vary in value, are not used. Also, the time constant is proportional to capacitor ratios as opposed to absolute analog capacitance values. Although capacitors also vary in value, capacitors can be ratioed and matched in a manner to minimize the effects of variation. In switched capacitor filters, amplifier frequency bandwidth must be much greater than an input signal sampling frequency, and the filter's input signal sampling frequency must be at least twice greater than the filter's pole frequency. However, switched capacitor filters are subject to frequency aliasing errors, require an additional filter stage known as an anti-aliasing filter and a smoothing filter, and have performance degradations at higher frequencies.

Another known category of analog filters is the continuous time filter. One known implementation of the continuous time filter uses both capacitors and resistors and an amplifier. In a continuous time filter, the frequency response is directly proportional to variation of the values of resistors and capacitors. Since these values vary greatly, the frequency response also varies. Therefore, a tuning circuit is often required for a continuous time filter.

Yet another known category of analog filters is the operational transconductance amplifier-capacitor (OTA-C) filter. An operational transconductance amplifier filter uses the transconductance (gm) of an operational amplifier as the resistance required to implement the filter. However, the transconductance of an amplifier is subject to nonlinear variation. Operational transconductance amplifiers also have relatively poor dynamic range and must be tunable.

A wide variety of known filter tuning circuits exists. A common method of filter tuning is to laser trim the resistors or capacitors, or both. A primary disadvantage with circuits having components which must be trimmed is the cost associated with the additional manufacturing and production. Another common tuning circuit which is used in connection with analog filters is the use of off-chip external discrete resistors and capacitors which are less susceptible to variation and which may be readily adjusted to tune the filter. A disadvantage with this method is the requirement for components external to a filter integrated circuit. External components add cost, increase integrated circuit pin count and provide opportunities for noise and error to be introduced into the filter operation. A further common tuning circuit is integrated with the filter, but uses switched capacitors to simulate resistors. Capacitors can be ratioed with one another to minimize the effects of varying capacitances. However, noise at the switching frequency is commonly introduced in this type of tuner. Yet another type of known filter tuning circuit is the phase lock loop technique which uses a phase detector, a loop filter, and a voltage controlled oscillator (VCO) to tune the filter. Phase lock loops require a large amount of circuitry in relation to the filter and typically introduce noise at a reference frequency provided for the phase lock loop. The reference frequency must also be equal to the filter's pole frequency. Therefore, additional clock frequency circuitry may be required to provide a specific reference frequency.

SUMMARY OF THE INVENTION

In accordance with the present invention, there is provided a circuit, comprising input means for receiving an analog input signal. The input means has a resistive/capacitive (RC) time constant and provides an intermediate signal having a value which varies between a first predetermined signal value and a second predetermined signal value during a time period determined by the resistive/capacitive time constant. An output means is coupled to the input means for receiving the intermediate signal and providing a digital equivalent of the analog input signal by providing a digital count value of cycles of a predetermined clock signal which are counted during the time period. In another form, a tuning circuit and method of operation for an analog filter is provided. The tuning circuit comprises an integrator having an input for receiving a first reference voltage and an output for providing an integration signal which varies from a first predetermined value to a second predetermined value within a time period. The time period is proportional to a time constant of the analog filter. A comparator has a first input coupled to the output of the integrator, a second input for receiving a second reference voltage which is greater in magnitude than the first reference voltage, and an output for providing an enable signal which maintains a predetermined logic value during the time period. A counter has a first input for receiving the output of the comparator, a second input for receiving a reference clock signal, and an output for providing an output count value of the time period. A decoder has an input coupled to the output of the counter. The decoder converts the output count value to a control signal for controlling and selectively modifying a component value of the analog filter to control the time constant of the analog filter to compensate for process variations affecting the time constant of the analog filter.

These and other features, and advantages, will be more clearly understood from the following detailed description taking in conjunction with the accompanying drawings. It is important to point out that there may be other embodiments of the present invention which are not specifically illustrated.

BRIEF DESCRIPTION OF THE DRAWINGS

FIG. 2 illustrates in table form a truth table of a decoder in the tuning circuit of FIG. 1.

DETAILED DESCRIPTION OF A PREFERRED EMBODIMENT

Figure 1:
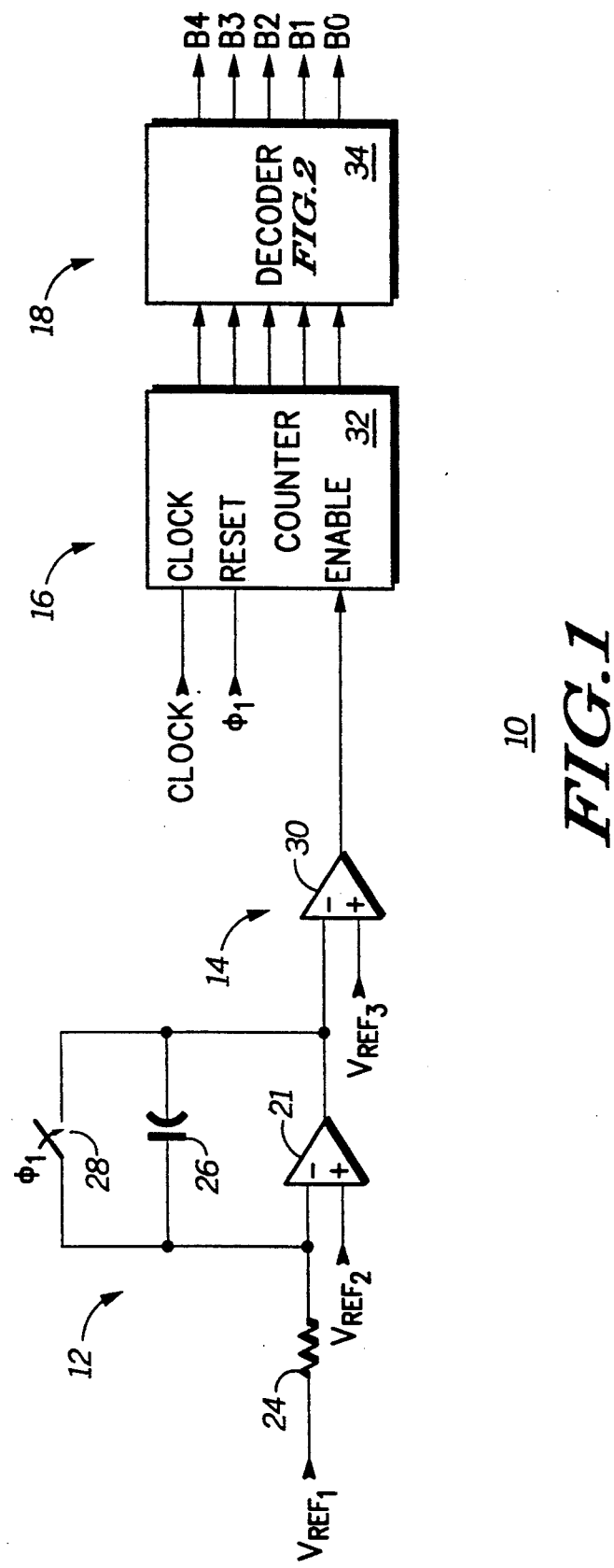
FIG. 1 illustrates in partial schematic form a tuning circuit in accordance with the present invention.

Illustrated in FIG. 1 is a tuning circuit 10 generally having an integrator with an input portion 12 and a comparator portion 14, a count portion 16, and a decode portion 18. In input portion 12 a resistor 24 has a first terminal connected to a first reference voltage, labeled "$V_{REF1}$". A second terminal of resistor 24 is connected to an inverting or negative input of an operational amplifier 21. A noninverting or positive input of operational amplifier 21 is connected to a second reference voltage labeled "$V_{REF2}$." A capacitor 26 has a first electrode connected to the negative input of operational amplifier 21. A second electrode of capacitor 26 is connected to an output of operational amplifier 21. A switch 28 has a first terminal connected to the first electrode of capacitor 26 and a second terminal connected to the output of operational amplifier 21. Switch 28 has a control terminal for receiving a control signal labeled "$\phi1$". Comparator portion 14 has an operational amplifier 30 having an inverting or negative input connected to the output of operational amplifier 21. A non-inverting or positive input of operational amplifier 30 is connected to a third reference voltage labeled "$V_{REF3}$." It should be noted that $V_{REF3}$ may have a voltage value which is either greater than or less than $V_{REF2}$. Each of the three reference voltages are referenced with respect to some predetermined voltage, preferably a supply voltage $V_{SS}$. An output of operational amplifier 30 is connected to an enable input of a counter 32 of the count portion 16. Control signal $\phi1$ is connected to a Reset input of counter 32, and a system clock signal labeled "CLOCK" is connected to a clock input of counter 32. Counter 32 provides a multi-bit count output. In the illustrated form, each of a plurality of five single-bit outputs is connected to one of a plurality of five inputs of a decoder 34 of decode portion 18. Decoder 34 provides five outputs respectively labeled "B0", "B1", "B2", "B3", and "B4".

In operation, tuning circuit 10 functions to provide a decoded output signal for use by an analog filter in adjusting the resistive/capacitive time constant of the filter to an optimum value. Because analog filters are made with analog components which vary in value over processing and temperature variations, adjustment of the analog components is desirable. Input portion 12 and comparator portion 14 function to provide an enable signal to counter 32 for a predetermined amount of time. However, this predetermined amount of time will vary primarily as the values of capacitor 26 and resistor 24 vary with respect to processing and temperature. Input portion 12 functions to integrate a fixed input current signal conducted at the negative input of operational amplifier 21. The time to perform this integration is proportional to the amount of time required to change capacitor 26 to substantially the $V_{REF2}$ voltage. Accordingly, switch 28 functions to periodically discharge capacitor 26 or autozero the operational amplifier 21. In particular, a ramp time, T ramp, of the integrator (i.e. time to integrate) may be represented in equation one below as:

$$T\ ramp = [(V_{REF3} - V_{REF2})/(V_{REF2} - V_{REF1})] * R_{24} * C_{26} \quad (1)$$

where $R_{24}$ is the resistance of resistor 24 and $C_{26}$ is the capacitance of capacitor 26. Comparator portion 14 functions to compare the output of input portion 12 with the value of $V_{REF3}$. Until the output of input portion 12 is greater than $V_{REF3}$ in value, counter 32 remains enabled. Once the output of input portion 12 equals $V_{REF3}$, counter 32 is disabled. During the time period which counter 32 is enabled, counter 32 is counting the number of clock cycles of the system CLOCK signal. The number of clock cycles which are counted while input portion 12 is integrating is provided by counter 32 as an output. The output of counter 32, may be represented in equation two below as:

$$Output\ of\ Counter\ 32 = [T\ ramp]/[T\ clock] \quad (2)$$

where $T_{clock}$ is the clock frequency period of the CLOCK signal connected to counter 32. The output of counter 32 is decoded into a binary output value represented by bits B0 thru B4. Bits B0 thru B4 are an encoded time constant variation compensation code of the RC time constant of input portion 12.

Illustrated in FIG. 2 is a truth table for decoder 34. In the illustrated form, five input bits and five output bits are discussed. It should be readily apparent that any number of decoder inputs/outputs may be utilized depending upon the amount of tuning resolution desired for the analog filtering. For a five-bit input, there are $2^5$ or thirty-two possible binary values. For each five-bit binary value, there is an assigned predetermined binary output. As may be readily noted in FIG. 2, some of the binary inputs are assigned to the same binary output value for controlling the analog filter. Before an analysis of the assignment of output values for bits B0-B4 is made, a discussion of the effect which control bits B0-B4 have on an analog filter is desirable.

Figure 3:
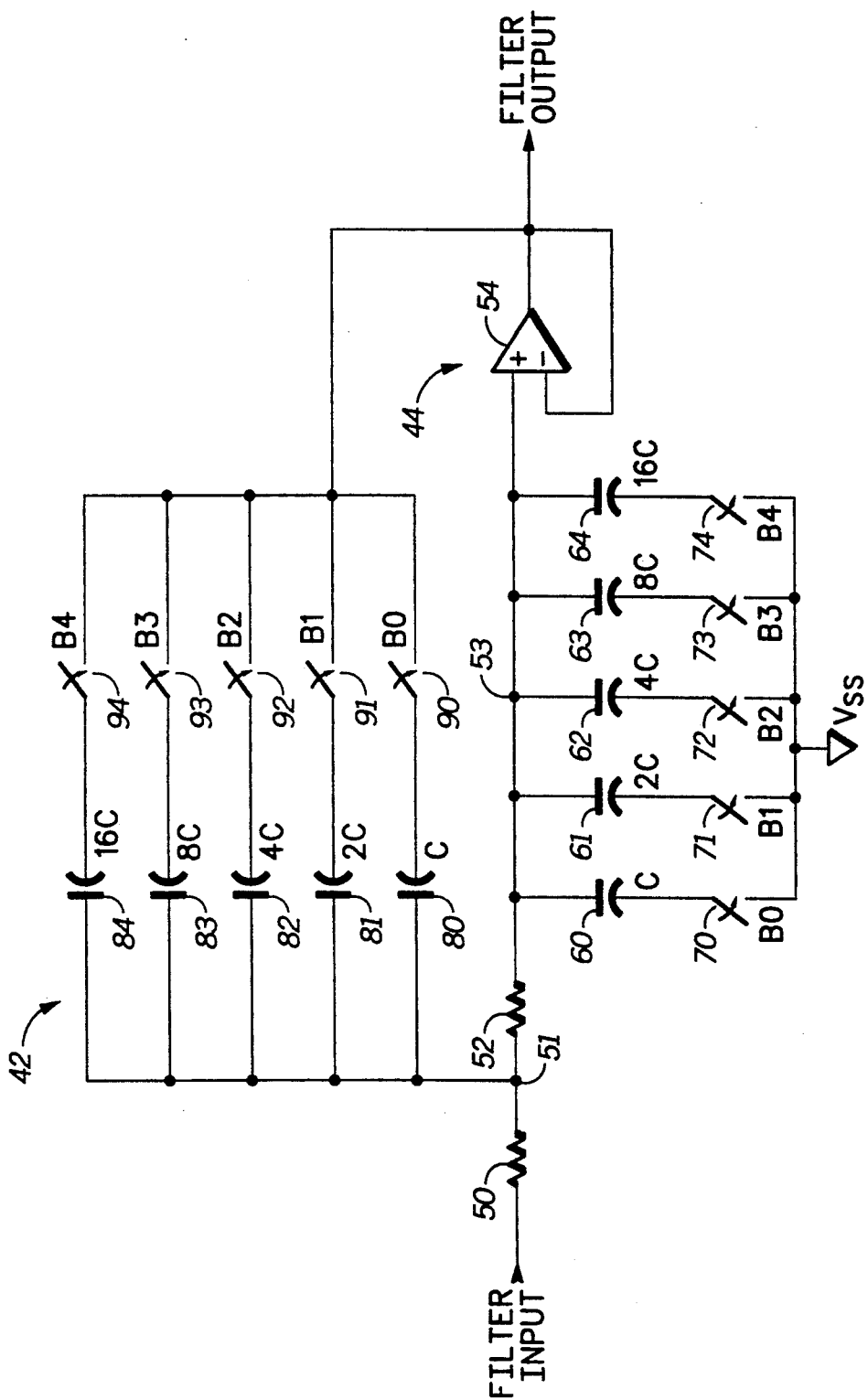
FIG. 3 illustrates in partial schematic form an analog filter for use with the tuning circuit of FIG. 1.

Illustrated in FIG. 3 is an analog filter 40. Analog filter 40 generally has a resistive/capacitive portion 42 and an amplifier portion 44. Within resistive/capacitive portion 42 there is provided an input terminal labeled "Filter input" for receiving a filter input. The input terminal is connected to a first terminal of a resistor 50. A second terminal of resistor 50 is connected at a node 51 to a first terminal of a resistor 52. A second terminal of resistor 52 is connected at a node 53 to a positive or noninverting input of an operational amplifier 54. Connected to node 53 is a first electrode of each of a plurality of binary weighted capacitors 60-64. For example, capacitor 60 has a designated unit weight of "C", capacitor 61 has a designated weight of "2C", capacitor 62 has a designated weight of "4C", and so forth. Each of capacitors 60-64 has a second electrode connected to a first terminal of a respective one of a plurality of switches 70-74. In other words, the second electrode of capacitor 60 is connected to the first terminal of switch 70, and so forth for capacitors 61-64 and switches 71-74. Each of switches 70-74 has a second terminal connected to a reference voltage terminal for receiving a supply voltage labeled "$V_{SS}$". Each of switches 70-74 has a control terminal for receiving a respective one of a plurality of control signals B0-B4 from the output of decoder 34 of FIG. 1. For example, the control terminal of switch 70 is connected to control signal B0, the control terminal of switch 71 is connected to control signal B1, and so forth. A first electrode of each of a plurality of binarily weighted capacitors 80-84 is connected to node 51. In the illustrated form, capacitor 80 has a designated unit weight of "C", capacitor 81 has a designated weight of "2C", capacitor 82 has a designated weight of "4C", and so forth. Each of capacitors 80-84 has a second electrode connected to a first terminal of a respective one of a plurality of switches 90-94. In other words, the second electrode capacitor 80 is connected to the first terminal of switch 90, and so forth for capacitors 81-84 and switches 91-94. Each of switches 90-94 has a second terminal connected to an inverting or negative input of operational amplifier 54. Each of switches 90-94 has a control terminal for respectively receiving control signals B0-B4 from decoder 34 of FIG. 1. An output of operational amplifier 54 is connected to the negative input thereof and to the second terminals of switches 90-94. The output of operational amplifier 54 provides an output of analog filter 40 labeled "Filter Output."

In operation, an analog filter input signal is coupled to filter 40 at the filter input and filtered by operational amplifier 54 in combination with the net capacitive effect of capacitors 60-64 and 80-84 and resistors 50, 52. Resistors 50, 52 and capacitors 60-64 and 80-84 function as a resistive/capacitive (RC) network having an effective RC time constant. The RC time constant establishes a frequency pole of filter 40. Each of the resistors 50, 52 and capacitors 60-64, 80-84 is subject to processing and temperature variation which can vary the frequency pole of filter 40 and otherwise vary the frequency response of the filter. The present invention functions to use tuner circuit 10 to vary the capacitance of resistance/capacitance portion 42 to compensate for variations in both the resistance and capacitance of resistance/capacitance portion 42. It should be well understood that the output of tuner 10 may be readily modified to also directly control only resistive values in analog filter 40 or a combination of both resistive and capacitive values. When both tuner circuit 10 and analog filter 40 are implemented in the same integrated circuit, variations in resistors 50, 52 and capacitors 60-64 and 80-84 will generally directly track with variations in resistor 24 and capacitor 26 provided all of the resistors are fabricated to be of the same type and physical orientation (i.e. circuit layout) and all of the capacitors are fabricated to be of the same type and physical orientation. Therefore, the RC time constants of both circuits are directly proportional. Accordingly, as the count value of counter 32 varies in response to capacitive and resistive variations, decoder 34 can provide a dynamic signal which will control the amount of effective capacitance in the resistance/capacitance portion 42. Therefore, an effective method exists to maintain a constant frequency pole for analog filter 40 by selecting a variable number of capacitors in a bank of capacitors.

Referring to FIG. 2 again, it is readily apparent that the output value can assume a B0-B4 signal value which has the effect of switching in all of capacitors 60-64 and capacitors 80-84 in resistance/capacitance portion 42. At the other extreme, the B0-B4 signal value may have the effect of switching only capacitors 60, 61 and 80-81 in resistance/capacitance portion 42. It should be noted that in the preferred form there is no B0-B4 output signal which has the effect of switching from only capacitor 60 to capacitor 61 and from capacitor 80 to capacitor 81. The reason to avoid switching from one unit of capacitance (i.e. capacitor 60) to two units of capacitance (i.e. capacitor 61) is to avoid a two-to-one or one hundred percent change which creates very poor tuning resolution. It should be noted that the lowest valued output signal provided by decoder 34 is equivalent to three units of capacitance. The next highest increment is to increase to four units of capacitance which is an increase having a less negative effect on resolution. A predetermined input value is chosen as being the value which represents the desired value of capacitance assuming that no error in the component values exists. The predetermined input value representing the desired value of capacitance should not preferably be in the middle of the input values. The predetermined input value representing the desired value of capacitance should be in the upper third of the range, i.e. in the lower value range of the inputs in order to permit better resolution at the low end of the capacitive switching range. The switching of capacitors having capacitive units between fifteen, sixteen, seventeen, eighteen, nineteen, twenty, etc. units of capacitance is a much smaller change in percentage than when changing between one, three, four, etc., units of capacitance. The truth table of FIG. 2 represents an efficient decoding which permits a deviation in the count value of counter 32 to be corrected with optimum resolution when using a five-bit count signal.

Although the present invention has been described up to this point in the specific context of a tuning circuit, it should be noted that the present invention provides a circuit which: (1) receives an analog input signal; (2) integrates the input signal with input portion 12; and (3) provides a digital equivalent of the analog input signal with count portion 16. The integration is related to a predetermined RC time constant, where the resistance may also be implemented as a transconductance rather than a resistance. In one application, the known RC time constant is utilized to adjust another RC time constant having the same physical and electrical properties of another circuit. In the more general sense of the present invention, the digital equivalent may be directly used if only a digital equivalent of the analog input signal is desired. In other forms, other decodings of the resulting digital equivalent of the analog input signal may be implemented.

Thus it is apparent that there has been provided, in accordance with the invention, a tuner circuit and method of operation for an analog filter that fully meets the needs and advantages set forth previously. The tuning circuit and method taught herein require no trimming or adjusting of component values. Also, no components which are external to an integrated circuit containing the filter are required. The tuner circuit taught herein does not rely on feedback and is therefore more stable than a phase lock loop. Although the invention has been described and illustrated with reference to specific embodiments thereof, it is not intended that the invention be limited to these illustrative embodiments. For example, the first reference voltage VREF1 and resistor 24 structure of FIG. 1 may be replaced with any type of device having a transconductance and an input signal. Also, although a specific circuit having a specific resolution is disclosed as the analog filter, it should be readily understood that other filter circuits may be used with the tuner taught herein. The decoder 34 may be implemented as a programmable logic device (PLA), by conventional logic circuitry, or by a memory, as well as in other known forms. Similarly, many known counter circuits may be utilized as counter 32 of the inventive tuner. Although capacitors having a binary weighting have been discussed, it should be readily apparent that capacitors having other weighting factors (i.e. terenary or logarithmic) may be used. Although a specific decoding has been provided for decoder 34, it should be noted that other decodings which implement a nonlinear relationship between the input and the output of decoder 34 may be used. Further, although an integrator is illustrated in the disclosed tuning circuit, other circuits which do not integrate but which have an RC time constant may be used. For example, a filter stage having an RC network may be used rather than an integrator. In such an example, the output of the filter stage is exponential rather than linear when an integrator is used. An implementation with an integrator is generally preferable because the linear output of the integrator ensures that the response time of comparator portion 14 will not be variable. If an exponential signal is input into comparator portion 14, the response time of the comparator will be variable. Those skilled in the art will recognize that modifications and variations can be made without departing from the spirit of the invention. Therefore, it is intended that this invention encompass all such variations and modifications as fall within the scope of the appended claims.

We claim:

1. A tuning circuit for use with a filter implemented on a same integrated circuit as the tuning circuit, the tuning circuit comprising:
    input means for receiving first, second, and third reference voltage, the first and second reference voltages differing in magnitude and the second and third reference voltages differing in magnitude, the input means having a defined and continuous resistive/capacitive (RC) time constant which is susceptible to variation from processing and temperature changes, and providing an intermediate signal having a value which assumes one of a first or a second logic state, the first logic state existing during a time period determined by the resistive/capacitive time constant;
    a counter having a clock input for receiving a clock signal, an enable input for receiving the intermediate signal, the counter counting clock cycles of the clock signal in response to the intermediate signal and periodically providing an output count signal representing a number of clock cycles of the clock signal, the output count signal varying in value only if the resistive/capacitive (RC) time constant varies; and
    output means coupled to the input means for receiving the output count signal and providing a decoded equivalent signal, the decoded equivalent signal controlling a frequency pole of the filter.

2. The tuning circuit of claim 1 wherein the input means provides the intermediate signal by integrating a current proportional to the first reference voltage.

3. The tuning circuit of claim 1 wherein the output means further comprise:
    a decoder coupled to the counter, for receiving the output count signal and performing a predetermined decoding to provide the decoded equivalent signal, the predetermined decoding implementing a truth table wherein each of a plurality of values of the output count signal is assigned a corresponding decoded equivalent signal value, at least two of the values of the output count signal having a same assigned decoded equivalent signal value.

4. The tuning circuit of claim 3 wherein the decoded equivalent signal is used to control the frequency pole of the filter by controlling a time constant of the filter, thereby compensating for process variations affecting the time constant of the filter.

5. The tuning circuit of claim 1 wherein the output count signal and the decoded equivalent signal are digital signals which each comprise five bits.

6. The tuning circuit of claim 1 wherein the input means further comprise:
    a resistor having a first terminal for receiving the first reference voltage, and having a second terminal;
    a first amplifier having a first input coupled to the second terminal of the resistor, a second input for receiving the second reference voltage, and an output;
    a capacitor having a first electrode connected directly to the first input of the first amplifier, and a second electrode connected directly to the output of the first amplifier;
    a switch having a first terminal connected directly to the first electrode of the capacitor and having a second terminal connected directly to the second electrode of the capacitor, and a control terminal coupled to a control signal; and
    a second amplifier having a first input coupled to the output of the first amplifier, a second input for receiving the third reference voltage, and an output for providing the intermediate signal.

7. A tuning circuit for an analog filter, comprising:
    an integrator having a time constant which is susceptible to variation from process and temperature variations, the integrator having a first input for receiving a first reference voltage, a second input for receiving a second reference voltage, and an output for providing an integration signal which varies from a first predetermined value to a second predetermined value within a time period which is proportional to a time constant of the analog filter, the integrator having a capacitor having a first electrode connected directly to the first input of the integrator and a second electrode connected directly to the output of the integrator;
    a comparator having a first input coupled to the output of the integrator, a second input for receiving a third reference voltage which differs in magnitude from the second reference voltage, and an output for providing an enable signal which maintains a predetermined logic value during the time period;
    a counter having a first input for receiving the output of the comparator, a second input for receiving a reference clock signal, and an output for providing an output count value of the time period, the output count value varying in value only if the time constant of the integrator varies from a predetermined value; and
    a decoder having an input coupled to the output of the counter, the decoder converting the output count value to a control signal for controlling and selectively modifying component connections of the analog filter to control the time constant of the analog filter to compensate for process variations affecting the time constant of the analog filter.

8. The tuning circuit of claim 7 wherein the second reference voltage has a greater magnitude than the first reference voltage.

9. The tuning circuit of claim 7 wherein the second reference voltage has a lesser magnitude than the first reference voltage.

10. A method of tuning an analog filter with a tuning circuit, comprising the steps of:

implementing the tuning circuit and the analog filter on a same integrated circuit, the tuning circuit and the analog filter each having a resistive/capacitive time constant;

providing the tuning circuit with a first input for receiving a first reference voltage, and providing the tuning circuit with a second input for receiving a second reference voltage, the first reference voltage differing in magnitude from the second reference voltage;

providing an integrator within the tuning circuit, the integrator using a same capacitive value in each of a plurality of time periods to provide an integration signal for each of the time periods, each of the time periods having a length determined by the resistive/capacitive time constant of the tuning circuit which is proportional to the resistive/capacitive time constant of the analog filter;

receiving at a third input of the tuning circuit a third reference voltage which differs in magnitude from the second reference voltage, and providing an enable signal in response thereto which maintains a predetermined logic value during the time period;

counting with a counter circuit in each of the plurality of time periods how long in time the enable signal remains in a predetermined logic state which represents a length of the time period, and providing an output count value for each of the plurality of time periods, the output count value varying between each of the time periods only if the resistive/capacitive time constant of the tuning circuit varies; and converting the output count value to a control signal for controlling and selectively modifying component connections of the analog filter to control the resistive/capacitive time constant of the analog filter to compensate for process and temperature variations affecting the resistive/capacitive time constant of the analog filter.

11. The method of claim 10 further comprising the step of:

periodically resetting the counter circuit between each of the plurality of time periods.

* * * * *